United States Patent
Cheon

(10) Patent No.: US 11,790,957 B2
(45) Date of Patent: *Oct. 17, 2023

(54) VOLTAGE GENERATING CIRCUIT AND A NONVOLATILE MEMORY APPARATUS USING THE VOLTAGE GENERATING CIRCUIT

(71) Applicant: SK hynix Inc., Icheon-si Gyeonggi-do (KR)

(72) Inventor: Jun Ho Cheon, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 79 days.

This patent is subject to a terminal disclaimer.

(21) Appl. No.: 17/512,455

(22) Filed: Oct. 27, 2021

(65) Prior Publication Data

US 2022/0051701 A1 Feb. 17, 2022

Related U.S. Application Data

(63) Continuation of application No. 16/919,739, filed on Jul. 2, 2020, now Pat. No. 11,189,324.

(30) Foreign Application Priority Data

Feb. 18, 2020 (KR) .................. 10-2020-0019836

(51) Int. Cl.
*G11C 5/14* (2006.01)
*G11C 8/08* (2006.01)
*G11C 7/12* (2006.01)

(52) U.S. Cl.
CPC .............. *G11C 5/147* (2013.01); *G11C 7/12* (2013.01); *G11C 8/08* (2013.01)

(58) Field of Classification Search
CPC .. G11C 5/147; G11C 7/12; G11C 8/08; G11C 13/0038; G11C 13/004; G11C 13/0069; G11C 13/0004; G11C 16/30; G11C 16/08
USPC ...................................... 365/189.09
See application file for complete search history.

(56) References Cited

U.S. PATENT DOCUMENTS

| 7,656,232 | B2 * | 2/2010 | Kim ..................... H03G 11/002 330/147 |
| 7,863,878 | B2 | 1/2011 | Park et al. |
| 7,969,798 | B2 | 6/2011 | Hwang et al. |
| 8,169,812 | B2 | 5/2012 | Lynch |
| 9,685,237 | B2 | 6/2017 | Park et al. |
| 10,340,867 | B2 * | 7/2019 | Singh ..................... G01H 17/00 |
| 10,840,864 | B2 * | 11/2020 | Singh ..................... H03F 3/345 |
| 2008/0238534 | A1 | 10/2008 | Mai et al. |
| 2009/0002073 | A1 * | 1/2009 | Kim ..................... H03G 11/002 330/279 |
| 2018/0367110 | A1 | 12/2018 | Singh et al. |

* cited by examiner

Primary Examiner — Tha-O H Bui
(74) Attorney, Agent, or Firm — WILLIAM PARK & ASSOCIATES LTD.

(57) ABSTRACT

A voltage generating circuit includes a voltage supplying circuit and a current biasing circuit. The voltage supplying circuit is configured to supply a first power voltage to an output node based on a first enable signal. The current biasing circuit is configured to control a bias current to flow from the output node based on a second enable signal. The second enable signal is enabled after the first enable signal is enabled.

18 Claims, 5 Drawing Sheets

VOLTAGE GENERATING CIRCUIT AND A NONVOLATILE MEMORY APPARATUS USING THE VOLTAGE GENERATING CIRCUIT

CROSS-REFERENCES TO RELATED APPLICATION

The present application is a continuation application of U.S. patent application Ser. No. 16/919,739, filed on Jul. 2, 2020, and claims priority under 35 U.S.C. § 119(a) to Korean application number 10-2020-0019836, filed on Feb. 18, 2020, in the Korean Intellectual Property Office, which is incorporated herein by reference in its entirety.

BACKGROUND

1. Technical Field

Various embodiments generally relate to an integrated circuit technology, and more particularly, to a voltage generating circuit and a nonvolatile memory apparatus using the voltage generating circuit.

2. Related Art

An electronic device may include many electronic components. A computer system, for example, may include a large number of electronic semiconductor components. The computer system may include a memory apparatus. Dynamic random access memory (DRAM) can store and output data at high and constant speed and is capable of a random access. Such advantages make DRAM widely used for a general memory apparatus. However, DRAM includes memory cells each composed of a capacitor, which makes DRAM have a volatile characteristic of losing stored data when a supply of power is cut off. In order to overcome such a disadvantage of DRAM, flash memory has been developed. A flash memory apparatus, for example, includes memory cells each composed of a floating gate, which makes the flash memory apparatus have a nonvolatile characteristic of retaining stored data even when a supply of power is cut off. However, the flash memory apparatus stores and outputs data at lower speed than DRAM and incapable of random access.

Recently, next-generation memory having high operation speed and nonvolatile characteristics have been developed. Examples of next-generation memory may include phase change RAM (PRAM), magnetic RAM (MRAM), resistive RAM (ReRAM) and ferroelectric RAM (FRAM). Next-generation memory apparatuses can operate at high speeds while having nonvolatile characteristics. In particular, PRAM includes memory cells formed of chalcogenide and can store data by changing the resistance values of the memory cells.

SUMMARY

In an embodiment, a voltage generating circuit may include a voltage supplying circuit and a current biasing circuit. The voltage supplying circuit may be configured to supply a first power voltage to an output node based on a first enable signal. An output voltage may be output from the output node. The current biasing circuit may be configured to control a bias current to flow from the output node based on a second enable signal. The second enable signal may be enabled after the first enable signal is enabled.

In an embodiment, a nonvolatile memory apparatus may include a memory cell, a bit line control circuit, and a word line control circuit. The memory cell may be coupled between a bit line and a word line. The bit line control circuit may be configured to supply a first voltage to a first global electrode coupled to the bit line in a read operation. The bit line control circuit may be configured to supply a second voltage to the first global electrode in a write operation. The word line control circuit may be configured to supply a third voltage to a second global electrode coupled to the word line in the read operation. The word line control circuit may be configured to supply a fourth voltage to the second global electrode in the write operation. The bit line control circuit may include a first voltage supplying circuit, a second voltage supplying circuit, and a current biasing circuit. The first voltage supplying circuit may be configured to supply the first voltage to the first global electrode based on a first enable signal and a first reference voltage. The second voltage supplying circuit may be configured to supply the second voltage to the first global electrode based on a second enable signal. The current biasing circuit may be configured to control a bias current to flow from the first global electrode based on a third enable signal.

In an embodiment, a voltage generating circuit may include a first transistor, a second transistor, and a third transistor. The first transistor may be coupled to a node to which a first power voltage is supplied, and the first transistor may receive a first enable signal at its gate. The second transistor may be coupled between the first transistor and an output node, and the second transistor may receive a reference voltage at its gate. An output voltage may be output from the output node. The third transistor may be coupled between the output node and a node to which a second power voltage is supplied, and may receive a second enable signal at its gate. The second enable signal may be enabled after the first enable signal is enabled.

DETAILED DESCRIPTION

Figure 1:
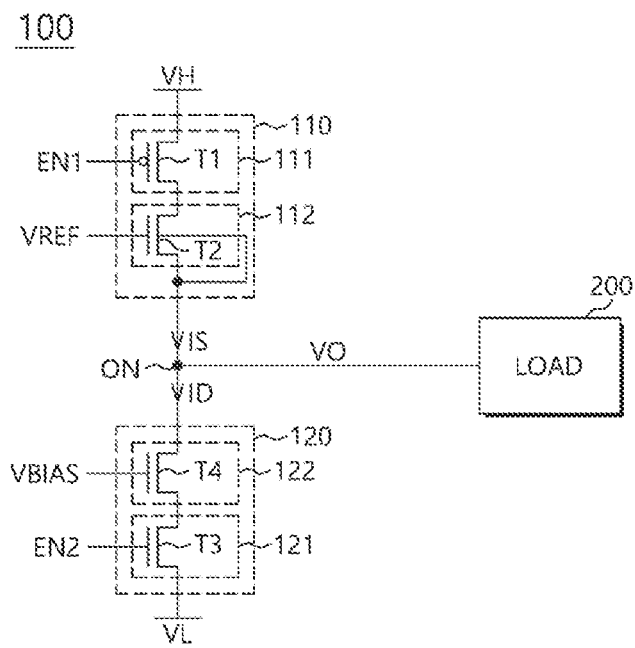
FIG. 1 is a diagram illustrating a configuration of a voltage generating circuit in accordance with an embodiment.

FIG. 1 is a diagram illustrating a configuration of a voltage generating circuit 100 in accordance with an embodiment. Referring to FIG. 1, the voltage generating circuit 100 may be supplied with a first power voltage VH and a second power voltage VL to generate an output voltage VO. The first power voltage VH may have a higher voltage level than the second power voltage VL. The voltage generating circuit 100 may provide the first power voltage VH to an output node ON, which is coupled to a load 200, to raise a voltage level of the output voltage VO. The voltage generating circuit 100 may control, when the voltage level of the output voltage VO rises to a predetermined voltage level or a greater voltage level, a bias current to flow from the output node ON to rapidly raise the voltage level of the output voltage VO to a target level.

The voltage generating circuit 100 may include a voltage supplying circuit 110 and a current biasing circuit 120. The voltage supplying circuit 110 may receive the first power voltage VH and a first enable signal EN1. The voltage supplying circuit 110 may supply, based on the first enable signal EN1, the first power voltage VH to the output node ON. The output voltage VO may be output through the output node ON. The voltage supplying circuit 110 may further receive a reference voltage VREF. The voltage supplying circuit 110 may adjust, based on the reference voltage VREF, a voltage supplied to the output node ON. The voltage supplying circuit 110 may clamp the voltage level of the first power voltage VH based on the reference voltage VREF and may provide the clamped voltage to the output node ON. The reference voltage VREF may adjust the target level of the output voltage VO. The output node ON may be coupled to the load 200. The load 200 may be any circuit configured to operate by utilizing the output voltage VO. The load 200 may be regarded as a capacitor having any capacitance. An equivalent circuit of the load 200 may be a capacitor.

The current biasing circuit 120 may receive the second power voltage VL and a second enabled signal EN2. The current biasing circuit 120 may control, based on the second enabled signal EN2, a current to flow from the output node ON to a node to which the second power voltage VL is supplied. The current flowing through the current biasing circuit 120 may be a bias current ID. The second enabled signal EN2 may be enabled later than the first enable signal EN1. That is, the second enable signal EN2 may be enabled after the first enable signal EN1 is enabled. The current biasing circuit 120 may control the bias current ID to flow from the output node ON to the node to which the second power voltage VL is supplied. Therefore, the current biasing circuit 120 may control the voltage supplying circuit 110 to operate as a source follower and may increase the drivability of the voltage supplying circuit 110. The current biasing circuit 120 may increase the drivability of the voltage supplying circuit 110 to make the output voltage VO more rapidly reach the target level. The current biasing circuit 120 may further receive a bias voltage VBIAS. The bias voltage VBIAS may adjust an amount of the bias current ID. In an embodiment, the second enabled signal EN2 may be modified to be disabled when the output voltage VO reaches the target level, and may optimize the power consumption of the voltage generating circuit 100.

The voltage supplying circuit 110 may include a first enable circuit 111 and a voltage clamping circuit 112. The first enable circuit 111 may provide the first power voltage VH based on the first enable signal EN1. The first enable circuit 111 may provide, when the first enable signal EN1 is enabled, the first power voltage VH to the voltage clamping circuit 112. The voltage clamping circuit 112 may clamp, based on the reference voltage VREF, a voltage provided from the first enable circuit 111 to generate the output voltage VO. The voltage clamping circuit 112 may clamp the voltage level of the first power voltage VH provided from the first enable circuit 111 and may provide the clamped voltage to the output node ON.

The current biasing circuit 120 may include a second enable circuit 121 and a current generating circuit 122. The second enable circuit 121 may form, based on the second enabled signal EN2, a current path between the output node ON and the node to which the second power voltage VL is supplied. The second enable circuit 121 may couple, when the second enabled signal EN2 is enabled, the output node ON to the node to which the second power voltage VL is supplied, to control the bias current ID to flow from the output node ON to the node to which the second power voltage VL is supplied. The current generating circuit 122 may adjust, based on the bias voltage VBIAS, an amount of a current flowing from the output node ON to the node to which the second power voltage VL is supplied. The current generating circuit 122 may adjust an amount of the bias current ID according to a voltage level of the bias voltage VBIAS.

The first enable circuit 111 may include a first transistor T1 and the voltage clamping circuit 112 may include a second transistor T2. The first transistor T1 may be a P-channel MOS transistor and the second transistor T2 may be a N-channel MOS transistor. The first transistor T1 may be coupled between a node to which the first power voltage VH is supplied, and the second transistor T2. The first transistor T1 may receive the first enable signal EN1 at its gate. The second transistor T2 may be coupled between the first transistor T1 and the output node ON. The second transistor T2 may receive the reference voltage VREF at its gate. The first transistor T1 may be coupled to the node to which the first power voltage VH is supplied, at its source, may be coupled to a drain of the second transistor T2 at its drain and may receive the first enable signal EN1 at its gate. The second transistor T2 may be coupled to the output node ON at its source and may receive the reference voltage VREF at its gate. The first transistor T1 and the second transistor T2 may provide a current IS to the output node ON to raise the voltage level of the output node ON. The first transistor T1 may receive the first power voltage VH at its back gate. The second transistor T2 may be coupled to the output node ON at its back gate. A target level of the output voltage VO may be determined on the basis of the voltage level of the reference voltage VREF and the threshold voltage of the second transistor T2. For example, the target level of the output voltage VO may correspond to a voltage level that drops from the reference voltage VREF by an amount of the threshold voltage of the second transistor T2.

The second enable circuit 121 may include a third transistor T3, and the current generating circuit 122 may include a fourth transistor T4. Each of the third transistor T3 and the fourth transistor T4 may be a N-channel MOS transistor. The third transistor T3 may be coupled between the node to which the second power voltage VL is supplied, and the fourth transistor T4. The third transistor T3 may receive the second enabled signal EN2 at its gate. The fourth transistor T4 may be coupled between the output node ON and the third transistor T3. The fourth transistor T4 may receive the bias voltage VBIAS at its gate. The third transistor T3 may be coupled to a source of the fourth transistor T4 at its drain, may be coupled to the node to which the second power voltage VL is supplied, at its source, and may receive the second enabled signal EN2 at its gate. The fourth transistor T4 may be coupled to the output node ON at its drain and may receive the bias voltage VBIAS at its gate.

Figure 2:
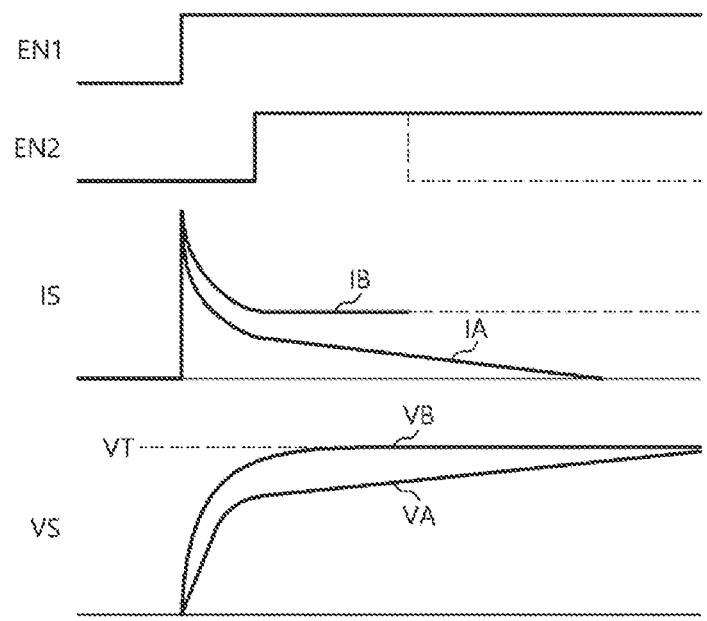
FIG. 2 is a diagram illustrating an operation of a voltage generating circuit in accordance with an embodiment.

FIG. 2 is a diagram illustrating an operation of the voltage generating circuit 100 in accordance with an embodiment.

Hereinafter, described with reference to FIGS. 1 and 2 will be the operation of the voltage generating circuit 100 in accordance with an embodiment. When the first enable signal EN1 is enabled for generation of the output voltage VO, the voltage generating circuit 100 may be activated. The first transistor T1 may be turned on because of the first enable signal EN1 and may output the first power voltage VH at its drain. The second transistor T2 may receive the reference voltage VREF and may provide, at its drain, the output node ON with a voltage that drops from the first power voltage VH by an amount of the threshold voltage of the second transistor T2. As the first transistor T1 and the second transistor T2 continuously provide the current IS to the output node ON, the voltage level of the output node ON and the output voltage VO may continuously rise. When the output voltage VO rises to a predetermined voltage level or a greater voltage level, the drivability of the voltage supplying circuit 110 may decrease and the amount of the current IS may substantially decrease. When the voltage level of the output node ON rises, the difference between the voltage level of the reference voltage VREF, which is input to the gate of the second transistor T2, and the voltage level of the output node ON may decrease. Therefore, the current drivability of the second transistor T2 may decrease and accordingly the amount of the current IS may decrease. Thus, according to prior art, the amount of the current IS may continuously decrease as time goes by, which is illustrated as "IA," and the output voltage VO may not reach the target level VT or may take quite a long time to reach the target level VT, which is illustrated as "VA." In accordance with an embodiment, the second enabled signal EN2 may be enabled at a time when the drivability of the voltage supplying circuit 110 decreases. When the second enabled signal EN2 is enabled, the third transistor T3 may be turned on. As the third transistor T3 is turned on, the bias current ID may flow from the output node ON to the node to which the second power voltage VL is supplied. As the bias current ID flows, the voltage supplying circuit 110 may operate as a source follower. When the bias current ID flows, the voltage level of the source of the second transistor T2 drops. Therefore, the difference between the gate voltage (i.e., the reference voltage VREF) and the source voltage of the second transistor T2 may be kept to a predetermined amount. Thus, the drivability of the second transistor T2 may be kept and accordingly the amount of the current ID may be constantly kept. At this time, because the load 200 may be regarded as a capacitor, a voltage level drop of the output voltage VO can be ignored due to the bias current ID. When the amount of the current IS is kept constant, which is illustrated as "IB," the output voltage VO may reach the target level VT more rapidly, which is illustrated as "VB." Therefore, the voltage generating circuit 100 may reduce a time required for the output voltage VO to settle to the target level VT. As illustrated with a broken line, the second enabled signal EN2 may be disabled when the output voltage VO reaches the target level VT. When the second enabled signal EN2 is disabled, the output node ON may be driven according to the current illustrated as "IA."

Figure 3:
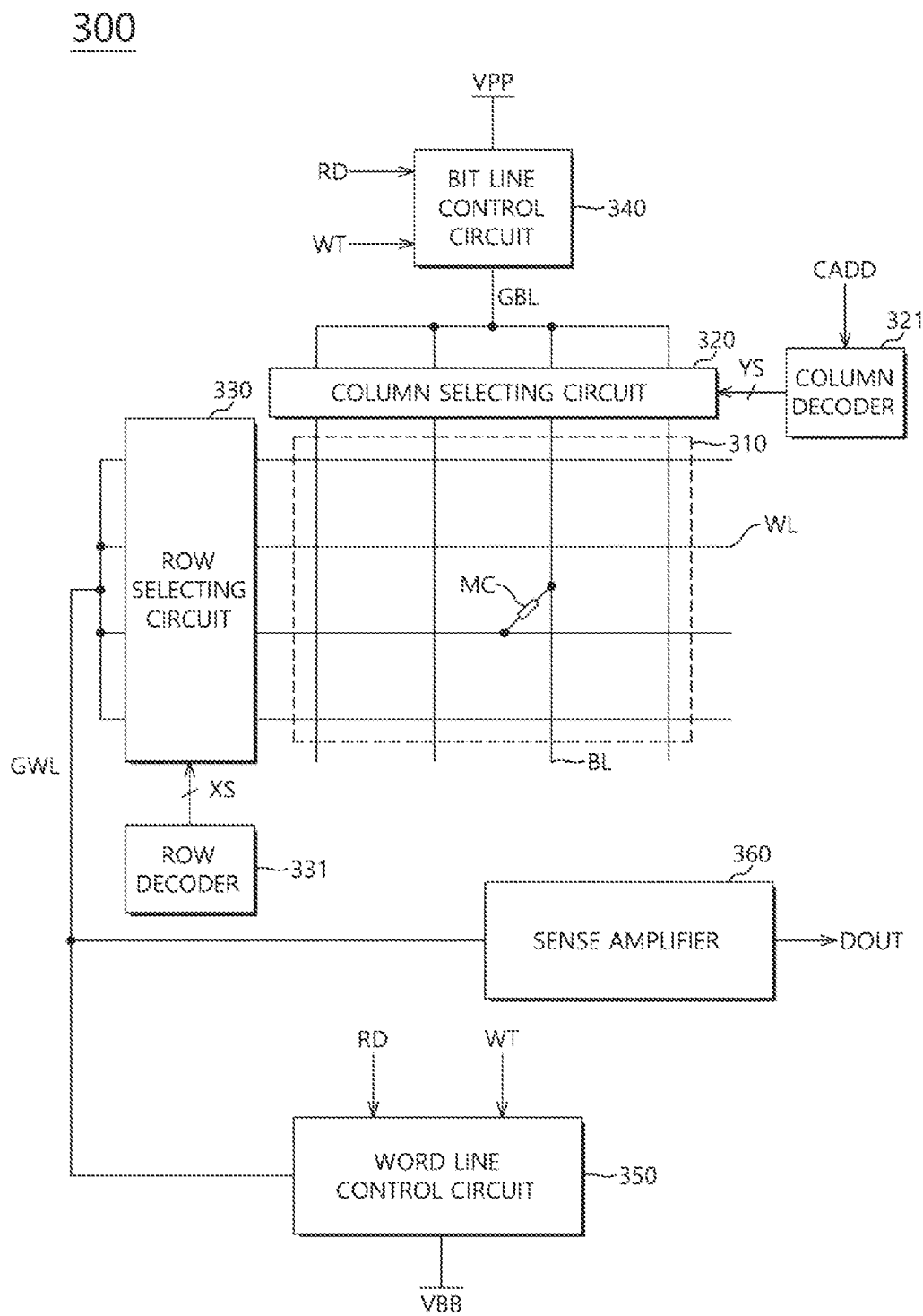
FIG. 3 is a diagram illustrating a configuration of a nonvolatile memory apparatus in accordance with an embodiment.

FIG. 3 is a diagram illustrating a configuration of a nonvolatile memory apparatus 300 in accordance with an embodiment. Referring to FIG. 3, the nonvolatile memory apparatus 300 may include a memory array 310. In the memory array 310, a plurality of bit lines BL may be disposed in a column direction, and a plurality of word lines WL may be disposed in a row direction. A plurality of memory cells MC may be coupled to cross-points between the plurality of bit lines BL and the plurality of word lines WL. Each of the plurality of memory cells MC may be coupled between a corresponding bit line BL and a corresponding word line WL. Each of the plurality of memory cells MC may be configured by a resistance change element and may include, for example, a phase change material. The nonvolatile memory apparatus 300 may be a resistive memory apparatus or a phase change memory apparatus. The memory array 310 may be a cross-point array.

The nonvolatile memory apparatus 300 may include a column selecting circuit 320 and a row selecting circuit 330. The column selecting circuit 320 may be coupled between a first global electrode GBL and the plurality of bit lines BL. The column selecting circuit 320 may couple a selected bit line, among the plurality bit lines BL, to the first global electrode GBL. Based on a column selection signal YS that may be generated on the basis of a column address signal CADD, the column selecting circuit 320 may select a particular bit line among the plurality bit lines BL and may couple the selected bit line to the first global electrode GBL. The row selecting circuit 330 may be coupled between a second global electrode GWL and the plurality of word lines WL. The row selecting circuit 330 may couple a selected word line, among the plurality word lines WL, to the second global electrode GWL. Based on a row selection signal XS that may be generated on the basis of a row address signal RADD, the row selecting circuit 330 may select a particular word line among the plurality word lines WL and may couple the selected word line to the second global electrode GWL.

The nonvolatile memory apparatus 300 may further include a column decoder 321 and a row decoder 331. The column decoder 321 may generate the column selection signal YS based on the column address signal CADD. In order for the column selecting circuit 320 to select a particular bit line, the column decoder 321 may decode the column address signal CADD to generate the column selection signal YS. The row decoder 331 may generate the row selection signal XS based on the row address signal RADD. In order for the row selecting circuit 330 to select a particular word line, the row decoder 331 may decode the row address signal RADD to generate the row selection signal XS.

The nonvolatile memory apparatus 300 may include a bit line control circuit 340, a word line control circuit 350, and a sense amp 360. The bit line control circuit 340 may be coupled to the first global electrode GBL. The bit line control circuit 340 may change a voltage level of the first global electrode GBL for read and write operations of the nonvolatile memory apparatus 300. The bit line control circuit 340 may provide the first global electrode GBL with a first voltage in a read operation and with a second voltage in a write operation. The second voltage may have a higher voltage level than the first voltage. The bit line control circuit 340 may receive a first power voltage VPP, a read signal RD, and a write signal WT. The bit line control circuit 340 may generate the first voltage from the first power voltage VPP based on the read signal RD. The bit line control circuit 340 may provide the first voltage to the first global electrode GBL. The bit line control circuit 340 may generate the second voltage from the first power voltage VPP based on the write signal WT. The bit line control circuit 340 may provide the second voltage to the first global electrode GBL.

The read signal RD may be enabled when the nonvolatile memory apparatus 300 performs a read operation. The read operation may be an operation that the nonvolatile memory apparatus 300 reads data stored in the memory array 310 and outputs the read data to an external apparatus of the nonvolatile memory apparatus 300. The write signal WT may be enabled when the nonvolatile memory apparatus 300 performs a write operation. The write operation may be an operation that the nonvolatile memory apparatus 300 receives data from an external apparatus and programs or stores the received data into the memory array 310. The write operation may include a reset write operation and a set write operation. The write signal WT may include a reset write signal and a set write signal. Each of the plurality of memory cells MC may be programmed to have a low-resistance state and a high-resistance state to store data. In an embodiment, each of the plurality of memory cells MC may have a plurality of low-resistance states and a plurality of high-resistance states and may store mufti-bit data. The reset write signal may be for programming each of the plurality of memory cells MC to have a high-resistance state. The set write signal may be for programming each of the plurality of memory cells MC to have a low-resistance state.

The word line control circuit 350 may be coupled to the second global electrode GWL. The word line control circuit 350 may change a voltage level of the second global electrode GWL for read and write operations of the nonvolatile memory apparatus 300. The word line control circuit 350 may provide the second global electrode GWL with a third voltage in a read operation and with a fourth voltage in a write operation. The fourth voltage may have a lower voltage level than the third voltage. The word line control circuit 350 may receive a third power voltage VBB, the read signal RD, and the write signal WT. The word line control circuit 350 may generate the third voltage from the third power voltage VBB based on the read signal RD. The word line control circuit 350 may provide the third voltage to the second global electrode GWL. The word line control circuit 350 may generate the fourth voltage from the third power voltage VBB based on the write signal WT. The word line control circuit 350 may provide the fourth voltage to the second global electrode GWL.

The third voltage may have a lower voltage level than the first voltage. A difference in voltage levels between the first voltage and the third voltage may correspond to a voltage level of a read voltage for reading data stored in a memory cell coupled to the first global electrode GBL and the second global electrode GWL to through a selected bit line and a selected word line. A difference in voltage levels between the second voltage and the fourth voltage may correspond to a voltage level of a write voltage and/or a program voltage for writing data into a memory cell coupled to the first global electrode GBL and the second global electrode GWL through a selected bit line and a selected word line.

Figure 4:
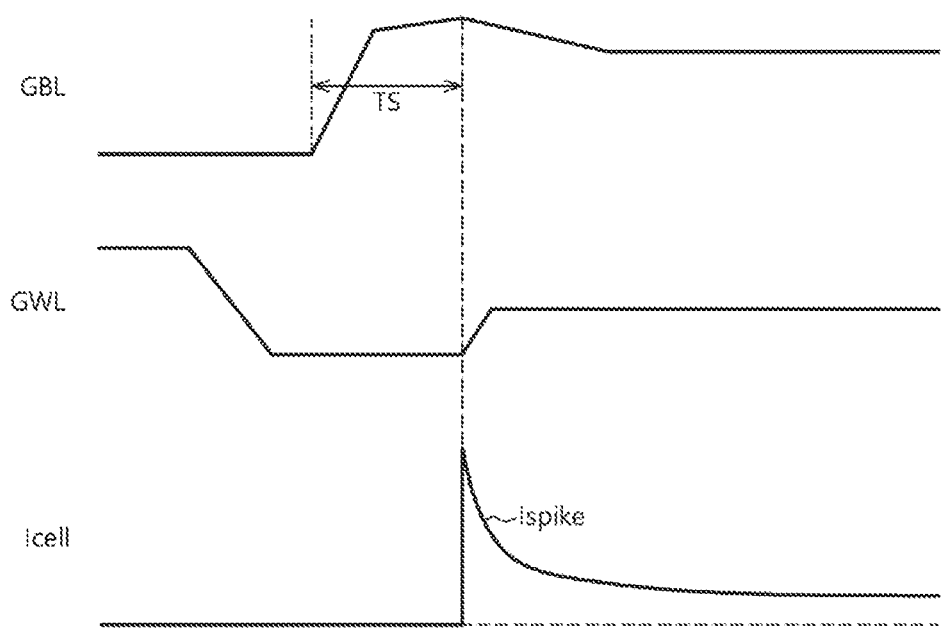
FIG. 4 is a diagram illustrating a read operation of the nonvolatile memory apparatus illustrated in FIG. 3.

FIG. 4 is a diagram illustrating a read operation of the nonvolatile memory apparatus 300 illustrated in FIG. 3. When the nonvolatile memory apparatus 300 performs a read operation, a particular bit line and a particular word line are selected according to the column selection signal YS and the row selection signal XS, and a memory cell coupled between the selected bit line and the selected word line may be accessed through the first global electrode GBL and the second global electrode GWL. The accessed memory cell may have a low-resistance state. It is assumed that the accessed memory cell is storing set data. When the nonvolatile memory apparatus 300 performs the read operation, the read signal RD may be enabled and the word line control circuit 350 may provide the third voltage to the second global electrode GWL. The voltage level of the second global electrode GWL may drop to a voltage level corresponding to the third voltage. After that, the bit line control circuit 340 may provide the first voltage to the first global electrode GBL. The voltage level of the first global electrode GBL may rise to a voltage level corresponding to the first voltage. When the voltage level of the first global electrode GBL reaches a target level and the difference in voltage levels between the first global electrode GBL and the second global electrode GWL reaches a threshold voltage of the memory cell, a snapback of the memory cell may occur. When the memory cell snaps back, the memory cell may be turned on and an amount of a current Icell flowing through the memory cell may surge. Therefore, a spike current Isipke may occur, as illustrated in FIG. 4. When a spike current Isipke occurs, the voltage level of the first global electrode GBL may slightly drop and the voltage level of the second global electrode GWL may slightly rise.

A settling time TS may be defined as an amount of time from when the bit line control circuit 340 provides the first voltage to the first global electrode GBL to when the first global electrode GBL reaches the target level. As the settling time TS becomes shorter, it may take less time for the snapback of the memory cell to occur. Therefore, an amount of time for the nonvolatile memory apparatus 300 to perform a read operation may be reduced. As well as the read operation, the reduced settling time TS of the first global electrode GBL may lead to a reduced amount of time for the nonvolatile memory apparatus 300 to perform a write operation. In order to reduce the settling time TS, the bit line control circuit 340 may be embodied by adopting the configuration of the voltage generating circuit 100 illustrated in FIG. 1.

Figure 5:
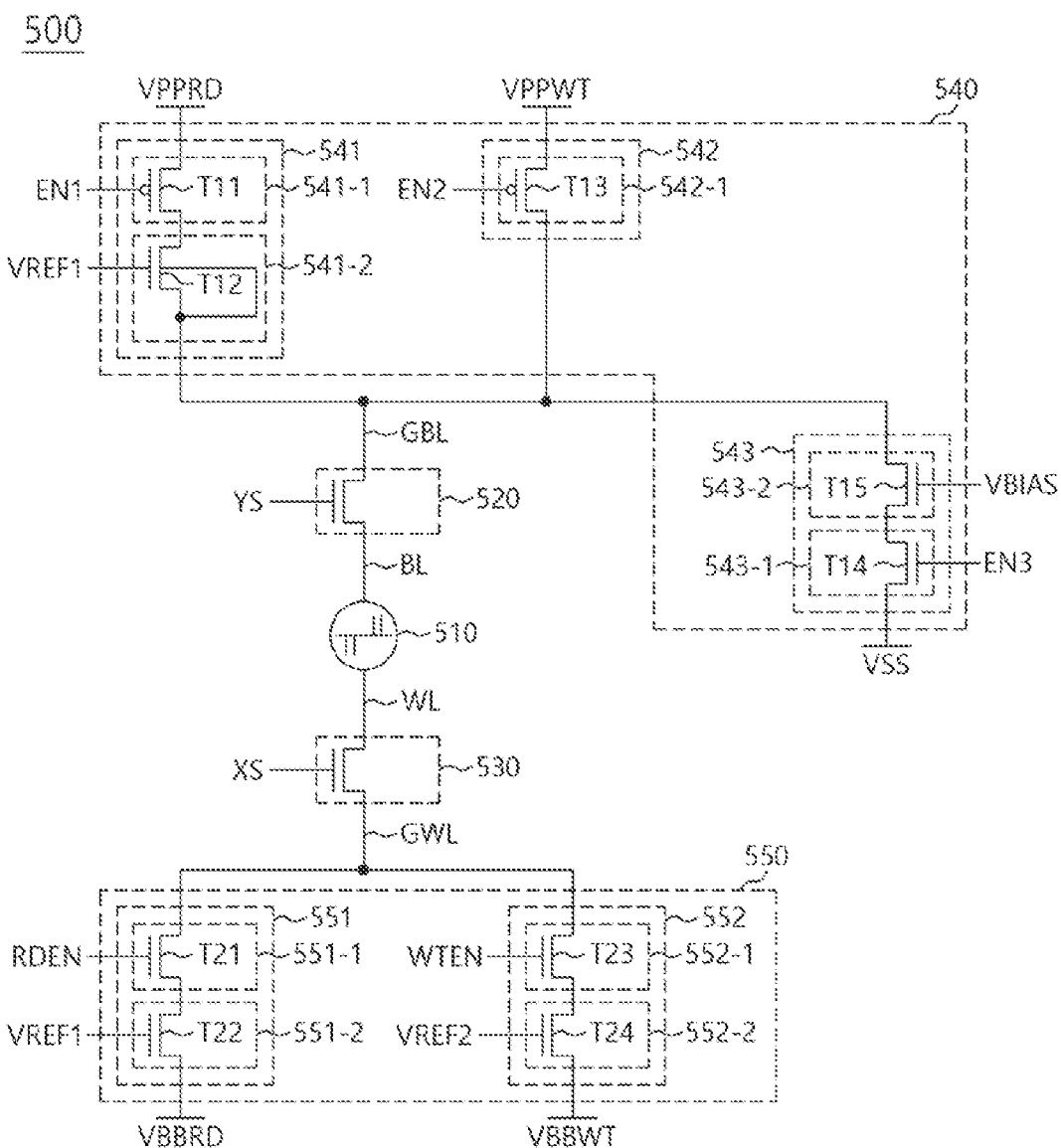
FIG. 5 is a diagram illustrating a configuration of a nonvolatile memory apparatus in accordance with an embodiment.

FIG. 5 is a diagram illustrating a configuration of a nonvolatile memory apparatus 500 in accordance with an embodiment. Referring to FIG. 5, the nonvolatile memory apparatus 500 may include a memory cell 510, a bit line control circuit 540, and a word line control circuit 550. The memory cell 510 may be coupled to a bit line BL at one end and may be coupled to a word line WL at the other end. The bit line BL may be coupled to the first global electrode GBL through a column selecting circuit 520. The column selecting circuit 520 may couple the bit line BL to the first global electrode GBL based on a column selection signal VS. The word line WL may be coupled to the second global electrode GWL through a row selecting circuit 530. The row selecting circuit 530 may couple the word line WL to the second global electrode GWL based on a row selection signal XS.

The bit line control circuit 540 may be coupled to the first global electrode GBL. The bit line control circuit 540 may provide a first voltage to the first global electrode GBL in a read operation. The bit line control circuit 540 may provide a second voltage to the first global electrode GBL in a write operation. The bit line control circuit 540 may provide the first voltage and the second voltage to the first global electrode GBL based on a read signal RD and a write signal WT. The second voltage may have a higher voltage level than the first voltage. The word line control circuit 550 may be coupled to the second global electrode GWL. The word line control circuit 550 may provide the second global electrode GWL with a third voltage in the read operation. The word line control circuit 550 may provide the second global electrode GWL with a fourth voltage in the write operation. The word line control circuit 550 may provide the third voltage and the fourth voltage to the second global electrode GWL based on the read signal RD and the write signal WT. The fourth voltage may have a lower voltage level than the third voltage. Difference in voltage levels between the first voltage and the third voltage may correspond to a voltage level of a read voltage for reading data stored in the memory cell 510 in the read operation. Difference in voltage levels between the second voltage and the fourth voltage may correspond to a voltage level of a write voltage for writing data into the memory cell 510 in the write operation.

The bit line control circuit 540 may include a first voltage supplying circuit 541, a second voltage supplying circuit 542, and a current biasing circuit 543. The first voltage supplying circuit 541 may receive a first power voltage VPP. The first voltage supplying circuit 541 may generate the first voltage based on a first enable signal EN1 and a first reference voltage VREF1. The first voltage supplying circuit 541 may provide the first voltage to the first global electrode GBL. The first enable signal EN1 may be generated, in the read operation, on the basis of the read signal RD illustrated in FIG. 3. The second voltage supplying circuit 542 may receive the first power voltage VPP. The second voltage supplying circuit 542 may generate the second voltage based on a second enable signal EN2. The second voltage supplying circuit 542 may provide the second voltage to the first global electrode GBL. The second enable signal EN2 may be generated, in the write operation, on the basis of the write signal WT illustrated in FIG. 3.

The current biasing circuit 543 may control a bias current to flow from the first global electrode GBL based on a third enable signal EN3. The current biasing circuit 543 may be coupled to a node to which a second power voltage VSS is supplied. The current biasing circuit 543 may control a current to flow from the first global electrode GBL to the node to which the second power voltage VSS is supplied, based on the third enable signal EN3. The second power voltage VSS may have a lower voltage level than the first power voltage VPP. The third enable signal EN3 may be generated on the basis of the read signal RD in the read operation. After the first enable signal EN1 is enabled on the basis of the read signal RD in the read operation, the third enable signal EN3 may be enabled. The current biasing circuit 543 may further receive a bias voltage VBIAS. The current biasing circuit 543 may adjust, based on the bias voltage VBIAS, an amount of a current flowing from the first global electrode GBL to the node to which the second power voltage VSS is supplied. In the read operation, the current biasing circuit 543 may control, based on the third enable signal EN3, the bias current to flow from the first global electrode GBL to the node to which the second power voltage VSS is supplied, to make the first voltage supplying circuit 541 operate as a source follower. When the voltage level of the first global electrode GBL rises by the first voltage supplying circuit 541, the current biasing circuit 543 may increase and/or keep the drivability of the first voltage supplying circuit 541 for the first global electrode GBL to rapidly settle to the voltage level of the first voltage.

The first voltage supplying circuit 541 may include a first enable circuit 541-1 and a first clamping circuit 541-2. The first enable circuit 541-1 may be coupled to a node to which the first power voltage VPP is supplied. The first enable circuit 541-1 may receive the first enable signal EN1. The first enable circuit 541-1 may provide, when the first enable signal EN1 is enabled, the first power voltage VPP to the first clamping circuit 541-2. The first clamping circuit 541-2 may receive the first reference voltage VREF1 and the first power voltage VPP that is provided from the first enable circuit 541-1. The first clamping circuit 541-2 may clamp the voltage level of the first power voltage VPP based on the first reference voltage VREF1. The first clamping circuit 541-2 may provide the clamped voltage level, as the first voltage, to the first global electrode GBL. A target level of the first voltage may be determined on the basis of the voltage level of the first reference voltage VREF1 and a threshold voltage of a transistor configuring the first clamping circuit 541-2.

The first enable circuit 541-1 may include a first transistor T11, and the first clamping circuit 541-2 may include a second transistor T12. The first transistor T11 may be a P-channel MOS transistor, and the second transistor T12 may be a N-channel MOS transistor. The first transistor T11 may be coupled between the node to which the first power voltage VPP is supplied and the second transistor T12 and may receive the first enable signal EN1 at its gate. The second transistor T12 may be coupled between the first transistor T11 and the first global electrode GBL and may receive the first reference voltage VREF1 at its gate. The second transistor T12 may be coupled to the first global electrode GBL at its back gate. A target level of the first voltage may correspond to a voltage level that drops from the voltage level of the first reference voltage VREF1 by an amount of a threshold voltage of the second transistor T12.

The second voltage supplying circuit 542 may include a second enable circuit 542-1. The second enable circuit 542-1 may be coupled to the node to which the first power voltage VPP is supplied. The second enable circuit 542-1 may receive the second enable signal EN2. The second enable circuit 542-1 may provide, when the second enable signal EN2 is enabled, the first power voltage VPP to the first global electrode GBL. The second enable circuit 542-1 may include a third transistor T13. The third transistor T13 may be a P-channel MOS transistor. The third transistor T13 may be coupled between the node to which the first power voltage VPP is supplied, and the first global electrode GBL. The third transistor T13 may receive the second enable signal EN2 at its gate.

The current biasing circuit 543 may include a third enable circuit 543-1 and a current generating circuit 543-2. The third enable circuit 543-1 may be coupled to the node to which the second power voltage VSS is supplied. The third enable circuit 543-1 may receive the third enable signal EN3. The third enable circuit 543-1 may form, when the third enable signal EN3 is enabled, a current path from the first global electrode GBL to the node to which the second power voltage VSS is supplied. The current generating circuit 543-2 may be coupled between the first global electrode GBL and the third enable circuit 543-1. The current generating circuit 543-2 may receive the bias voltage VBIAS. The current generating circuit 543-2 may set, based on the bias voltage VBIAS, an amount of a current flowing from the first global electrode GBL to the node to which the second power voltage VSS is supplied.

The third enable circuit 543-1 may include a fourth transistor T14, and the current generating circuit 543-2 may include a fifth transistor T15. Each of the fourth transistor T14 and the fifth transistor T15 may be a N-channel MOS transistor. The fourth transistor T14 may be coupled between the fifth transistor T15 and the node to which the second power voltage VSS is supplied, and may receive the third enable signal EN3 at its gate. The fifth transistor T15 may be coupled between the first global electrode GBL and the fourth transistor T14 and may receive the bias voltage VBIAS at its gate.

The word line control circuit 550 may include a third voltage supplying circuit 551 and a fourth voltage supplying circuit 552. The third voltage supplying circuit 551 may receive the third power voltage VBB. The third voltage supplying circuit 551 may generate the third voltage based on a read enable signal RDEN and the first reference voltage VREF1. The third power voltage VBB may have a lower voltage level than the second power voltage VSS. The third voltage supplying circuit 551 may provide the third voltage to the second global electrode GWL. The read enable signal RDEN may be generated on the basis of the read signal RD in the read operation. The read enable signal RDEN may be enabled prior to the first enable signal EN1. The fourth voltage supplying circuit 552 may receive the third power voltage VBB. The fourth voltage supplying circuit 552 may generate the fourth voltage based on a write enable signal WTEN and a second reference voltage VREF2. The second reference voltage VREF2 may have a higher voltage level than the first reference voltage VREF1. The fourth voltage supplying circuit 552 may provide the fourth voltage to the second global electrode GWL. The write enable signal WTEN may be generated on the basis of the write signal WT in the write operation. The write enable signal WTEN may be enabled prior to the second enable signal EN2.

The third voltage supplying circuit 551 may include a fourth enable circuit 551-1 and a second clamping circuit 551-2. The fourth enable circuit 551-1 may be coupled to the second global electrode GWL. The fourth enable circuit 551-1 may receive the read enable signal RDEN. The fourth enable circuit 551-1 may provide, when the read enable signal RDEN is enabled, the third voltage to the second global electrode GWL. The second clamping circuit 551-2 may be coupled between the fourth enable circuit 551-1 and a node to which the third power voltage VBB is supplied. The second clamping circuit 551-2 may receive the first reference voltage VREF1. The second clamping circuit 551-2 may clamp, based on the first reference voltage VREF1, an amount of a current flowing through the second global electrode GWL. The second clamping circuit 551-2 may clamp a current flowing from the second global electrode GWL to the node to which the third power voltage VBB is supplied, to generate the third voltage. The second clamping circuit 551-2 may provide the third voltage to the fourth enable circuit 551-1. The fourth enable circuit 551-1 may include a first transistor T21, and the second clamping circuit 551-2 may include a second transistor T22. Each of the first transistor T21 and the second transistor T22 may be an N-channel MOS transistor. The first transistor T21 may be coupled between the second global electrode GWL and the second transistor T22 and may receive the read enable signal RDEN at its gate. The second transistor T22 may be coupled between the first transistor T21 and the node to which the third power voltage VBB is supplied, and may receive the first reference voltage VREF1 at its gate.

The fourth voltage supplying circuit 552 may include a fifth enable circuit 552-1 and a third clamping circuit 552-2. The fifth enable circuit 552-1 may be coupled to the second global electrode GWL. The fifth enable circuit 552-1 may receive the write enable signal WTEN. The fifth enable circuit 552-1 may provide, when the write enable signal WTEN is enabled, the fourth voltage to the second global electrode GWL. The third clamping circuit 552-2 may be coupled between the fifth enable circuit 552-1 and the node to which the third power voltage VBB is supplied. The third clamping circuit 552-2 may receive the second reference voltage VREF2. The third clamping circuit 552-2 may clamp, based on the second reference voltage VREF2, an amount of a current flowing through the second global electrode GWL. The third clamping circuit 552-2 may clamp a current flowing from the second global electrode GWL to the node to which the third power voltage VBB is supplied, to generate the fourth voltage. The third clamping circuit 552-2 may provide the fourth voltage to the fifth enable circuit 552-1. The fifth enable circuit 552-1 may include a third transistor T23 and the third clamping circuit 552-2 may include a fourth transistor T24. Each of the third transistor T23 and the fourth transistor T24 may be an N-channel MOS transistor. The third transistor T23 may be coupled between the second global electrode GWL and the fourth transistor T24 and may receive the write enable signal WTEN at its gate. The fourth transistor T24 may be coupled between the third transistor T23 and the node to which the third power voltage VBB is supplied, and may receive the second reference voltage VREF2 at its gate.

Figure 6:
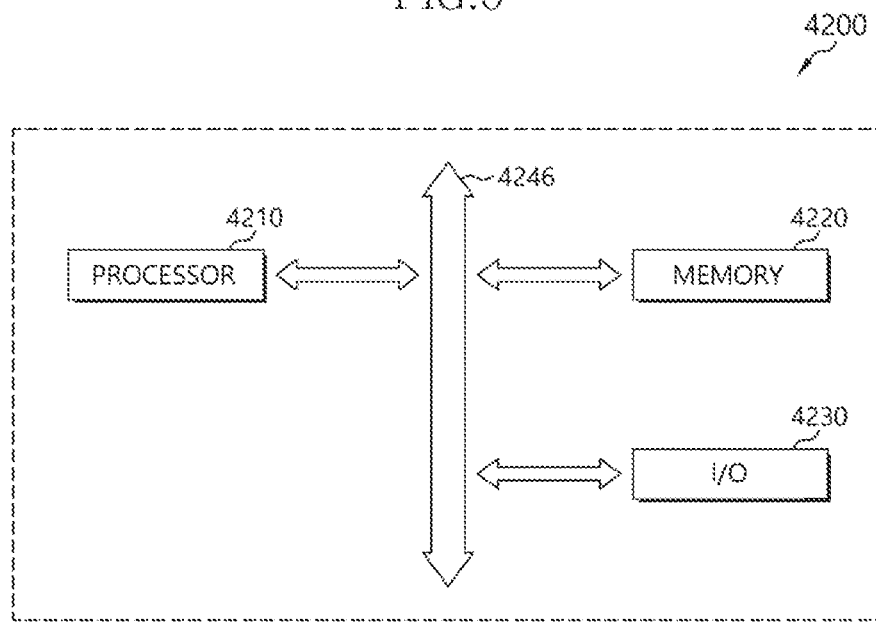
FIG. 6 is a block diagram illustrating an electronic apparatus including a nonvolatile memory apparatus in accordance with an embodiment.

FIG. 6 is a block diagram illustrating an electronic apparatus 4200 including a nonvolatile memory apparatus in accordance with an embodiment. Referring to FIG. 6, the electronic apparatus 4200 may include a processor 4210, a memory 4220, and an input/output device (I/O) 4230. The processor 4210, the memory 4220, and the input/output device 4230 may be coupled through a bus 4246.

The memory 4220 may receive a control signal from the processor 4210. The memory 4220 may store a code and data for the operation of the processor 4210. The memory 4220 may be utilized to store data to be accessed through the bus 4246. The memory 4220 may include at least one of the nonvolatile memory apparatuses 300 and 500 described above. In order for concrete realization and modification of an embodiment, an additional circuit and an additional control signal may be provided.

The electronic apparatus 4200 may configure various electronic control apparatuses requiring the memory 4220. For example, the electronic apparatus 4200 may be utilized in a computer system, a wireless communication device, a personal digital assistant (PDA), a laptop computer, a portable computer, a web tablet, a wireless phone, a portable phone, a digital music player, a MPEG audio layer 3 (MP3) player, a navigator, a solid state disk (SSD), a household appliance, or all devices capable of wirelessly transmitting and receiving information.

Figure 7:
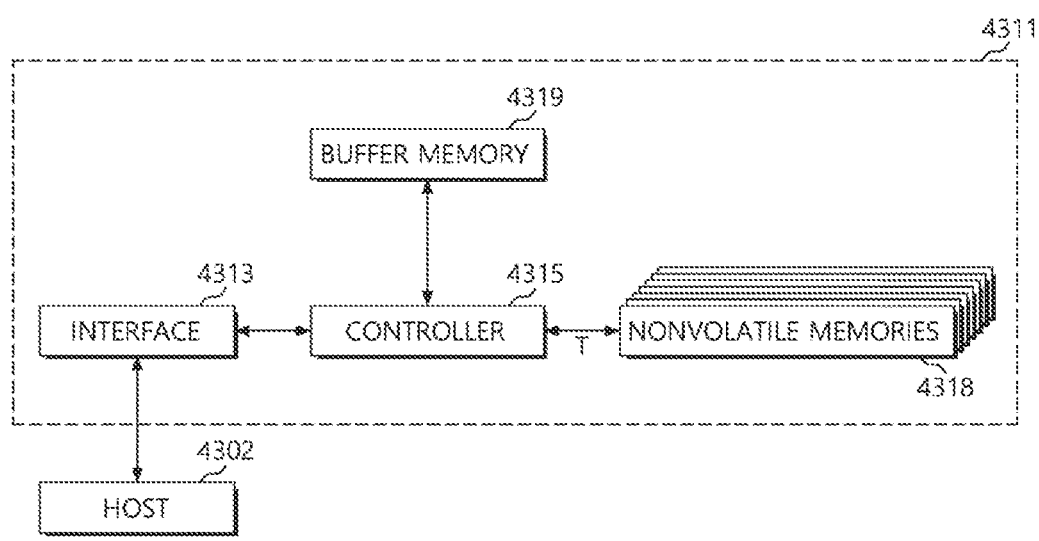
FIG. 7 is a block diagram illustrating a data storage device including a nonvolatile memory apparatus in accordance with an embodiment.

FIG. 7 is a block diagram illustrating a data storage device including a nonvolatile memory apparatus in accordance with an embodiment. Referring to FIG. 7, a data storage device such as a solid state disk (SSD) 4311 may be provided. The solid state disk 4311 may include an interface 4313, a controller 4315, nonvolatile memories 4318, and a buffer memory 4319.

The solid state disk 4311 stores information by utilizing a semiconductor device. The solid state disk 4311 has advantages of a high operation speed, reduced mechanical delay, reduced failure rate, reduced heat generation and noise generation, and reduced form factor and weight when compared to a hard disk drive (HDD). The solid state disk 4311 may be widely utilized in a notebook PC, a net book, a desktop PC, an MP3 player, or a portable storage device.

The controller 4315 may be provided adjacent to the interface 4313 and may be electrically coupled to the interface 4313. The controller 4315 may be a microprocessor including a memory controller and a buffer controller. The nonvolatile memories 4318 may be provided adjacent to the controller 4315 and may be electrically coupled to the controller 4315 via connection terminals T. The data storage capacity of the solid state disk 4311 may correspond to the nonvolatile memories 4318. The buffer memory 4319 may be provided adjacent to the controller 4315 and may be electrically coupled to the controller 4315.

The interface 4313 may be coupled to a host 4302 and may transfer electrical signals such as data. For example, the interface 4313 may operate according to standards such as the Serial Advanced Technology Attachment (SATA), the Integrated Drive Electronics (IDE), the Small Computer System Interface (SCSI) and/or combination thereof. The nonvolatile memories 4318 may be coupled to the interface 4313 via the controller 4315.

The nonvolatile memories 4318 may store data received through the interface 4313. The nonvolatile memories 4318 may include at least one between the nonvolatile memory apparatuses 300 and 500 in accordance with an embodiment, as described above. The nonvolatile memories 4318 have a characteristic that the data stored therein are kept even when power supplied to the solid state disk 4311 is cut off.

The buffer memory 4319 may include volatile memory or nonvolatile memory. The volatile memory may be DRAM and/or SRAM. The nonvolatile memory may include at least one of the nonvolatile memory apparatuses 300 and 500 in accordance with an embodiment, as described above.

The data processing speed of the interface 4313 may be relatively fast when compared to the operation speed of the nonvolatile memories 4318. The buffer memory 4319 may temporarily store data. The data received through the interface 4313 may be temporarily stored in the buffer memory 4319 via the controller 4315, and then, may be non-temporarily stored in the nonvolatile memories 4318 in conformity with the data writing speed of the nonvolatile memories 4318.

The data frequently used among the data stored in the nonvolatile memories 4318 may be read in advance and be temporarily stored in the buffer memory 4319. The buffer memory 4319 may increase the effective operation speed and may decrease an error occurrence rate of the solid state disk 4311.

While certain embodiments have been described above, it will be understood by those skilled in the art that the embodiments described are by way of example only. Accordingly, the voltage generating circuit and the nonvolatile memory apparatus using the same should not be limited based on the described embodiments. Rather, the voltage generating circuit and the nonvolatile memory apparatus using the same described herein should only be limited in light of the claims that follow when taken in conjunction with the above description and accompanying drawings.

What is claimed is:

1. A voltage generating circuit comprising:
    a voltage supplying circuit configured to supply a first power voltage to an output node based on a first enable signal and clamp a voltage level of the output node based on a reference voltage; and
    a current biasing circuit configured to control a bias current to flow from the output node based on a second enable signal.

2. The voltage generating circuit of claim 1, wherein the voltage supplying circuit includes:
    a first enable circuit configured to provide the first power voltage based on the first enable signal; and
    a clamping circuit configured to clamp a voltage provided from the first enable circuit to generate the output voltage based on the reference voltage.

3. The voltage generating circuit of claim 1, wherein the voltage supplying circuit includes:
    a first transistor coupled to a node to which the first power voltage is supplied, the first transistor configured to receive the first enable signal at its gate; and
    a second transistor coupled between the first transistor and the output node, the second transistor configured to receive a reference voltage at its gate.

4. The voltage generating circuit of claim 3, wherein the second transistor is coupled to the output node at a back gate of the second transistor.

5. The voltage generating circuit of claim 1, wherein the current biasing circuit includes:
    a second enable circuit configured to form a current path from the output node to a node to which a second power voltage is supplied, based on the second enable signal; and
    a current generating circuit configured to adjust an amount of a current flowing from the output node to the node to which the second power voltage is supplied, based on a bias voltage.

6. The voltage generating circuit of claim 1, wherein the current biasing circuit includes:
    a third transistor coupled to a node to which a second power voltage is supplied, the third transistor configured to receive the second enable signal at its gate; and
    a fourth transistor coupled between the output node and the third transistor, the fourth transistor configured to receive a bias voltage at its gate.

7. The voltage generating circuit of claim 1, wherein the second enable signal that is enabled after the first enable signal is enabled.

8. A voltage generating circuit comprising:
    a voltage supplying circuit configured to supply a first power voltage to an output node based on a first enable signal; and
    a current biasing circuit configured to control a bias current to flow from the output node based on a second enable signal and adjust amount of the bias current based on a bias voltage.

9. The voltage generating circuit of claim 8, wherein the voltage supplying circuit includes:
    a first enable circuit configured to provide the first power voltage based on the first enable signal; and
    a clamping circuit configured to clamp a voltage provided from the first enable circuit to generate the output voltage based on a reference voltage.

10. The voltage generating circuit of claim 8, wherein the voltage supplying circuit includes:
    a first transistor coupled to a node to which the first power voltage is supplied, the first transistor configured to receive the first enable signal at its gate; and
    a second transistor coupled between the first transistor and the output node, the second transistor configured to receive a reference voltage at its gate.

11. The voltage generating circuit of claim 10, wherein the second transistor is coupled to the output node at a back gate of the second transistor.

12. The voltage generating circuit of claim 8, wherein the current biasing circuit includes:
    a second enable circuit configured to form a current path from the output node to a node to which a second power voltage is supplied, based on the second enable signal; and
    a current generating circuit configured to adjust an amount of a current flowing from the output node to the node to which the second power voltage is supplied, based on a bias voltage.

13. The voltage generating circuit of claim 8, wherein the current biasing circuit includes:
    a third transistor coupled to a node to which a second power voltage is supplied, the third transistor configured to receive the second enable signal at its gate; and
    a fourth transistor coupled between the output node and the third transistor, the fourth transistor configured to receive a bias voltage at its gate.

14. The voltage generating circuit of claim 8, wherein the second enable signal that is enabled after the first enable signal is enabled.

15. A voltage generating circuit comprising:
- a first transistor coupled to a node to which a first power voltage is supplied, the first transistor configured to receive a first enable signal at its gate;
- a second transistor coupled between the first transistor and an output node, the second transistor configures to receive a reference voltage at its gate; and
- a third transistor coupled between the output node and a node to which a second power voltage is supplied, the third transistor configured to receive a second enable signal at its gate.

16. The voltage generating circuit of claim 15, wherein the second transistor is coupled to the output node at a back gate of the second transistor.

17. The voltage generating circuit of claim 15, further comprising a fourth transistor coupled between the output node and the third transistor, the fourth transistor configured to receive a bias voltage at its gate.

18. The voltage generating circuit of claim 15, wherein the second enable signal that is enabled after the first enable signal is enabled.

\* \* \* \* \*